(12) United States Patent
Hossain et al.

(10) Patent No.: US 8,138,033 B2
(45) Date of Patent: Mar. 20, 2012

(54) SEMICONDUCTOR COMPONENT AND METHOD OF MANUFACTURE

(75) Inventors: Zia Hossain, Tempe, AZ (US); Francine Y. Robb, Fountain Hills, AZ (US); Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 627 days.

(21) Appl. No.: 11/746,437

(22) Filed: May 9, 2007

(65) Prior Publication Data

US 2008/0277694 A1 Nov. 13, 2008

(51) Int. Cl.
*H01L 21/44* (2006.01)
*H01L 29/76* (2006.01)
*H01L 27/095* (2006.01)

(52) U.S. Cl. . 438/167; 257/213; 257/471; 257/E29.226; 257/E21.476; 257/E27.068

(58) Field of Classification Search .................. 438/167, 438/92, 169, 534, 570; 257/281, 471, E51.009, 257/E33.051, E31.074, E27.068, E29.041, 257/E29.178, 213, E29.226, E21.476
See application file for complete search history.

(56) References Cited

U.S. PATENT DOCUMENTS

| | | | |
|---|---|---|---|
| 5,365,102 A | 11/1994 | Mehrotra et al. | |
| 5,814,874 A | 9/1998 | Igel | |
| 7,199,442 B2 * | 4/2007 | Shenoy | 257/471 |
| 7,220,661 B1 * | 5/2007 | Yu et al. | 438/570 |
| 2005/0029585 A1 | 2/2005 | He et al. | |
| 2006/0084221 A1 | 4/2006 | Moran et al. | |
| 2006/0180857 A1 | 8/2006 | Loechelt et al. | |
| 2006/0208332 A1 | 9/2006 | Duskin et al. | |
| 2006/0220140 A1 | 10/2006 | Robb et al. | |
| 2007/0235830 A1 * | 10/2007 | Hamerski et al. | 257/471 |
| 2009/0026586 A1 * | 1/2009 | Anderson | 257/623 |

FOREIGN PATENT DOCUMENTS

WO 2006/116219 A1 11/2006

OTHER PUBLICATIONS

Article entitled, "The Effects of Double-Epilayer Structure on Threshold Voltage of Ultralow Voltae Trench Power MOSFET Devices", Qi Wang et al., IEEE Transactions on Electron Devices, vol. 54, No. 4, Apr. 2007, pp. 833-839.
B. Jayant Baliga, "Power Semiconductor Devices," 1996, pp. 81-102, PWS Publishing Company, Boston, USA.

* cited by examiner

*Primary Examiner* — Matthew W Such
*Assistant Examiner* — Monica D Harrison
(74) *Attorney, Agent, or Firm* — Rennie William Dover (57) ABSTRACT

A semiconductor component that includes a Schottky device, an edge termination structure, a non-Schottky semiconductor device, combinations thereof and a method of manufacturing the semiconductor component. A semiconductor material includes a first epitaxial layer disposed on a semiconductor substrate and a second epitaxial layer disposed on the first epitaxial layer. The second epitaxial layer has a higher resistivity than the semiconductor substrate. A Schottky device and a non-Schottky semiconductor device are manufactured from the second epitaxial layer. In accordance with another embodiment, a semiconductor material includes an epitaxial layer disposed over a semiconductor substrate. The epitaxial layer has a higher resistivity than the semiconductor substrate. A doped region is formed in the epitaxial layer. A Schottky device and a non-Schottky semiconductor device are manufactured from the epitaxial layer.

19 Claims, 9 Drawing Sheets

SEMICONDUCTOR COMPONENT AND METHOD OF MANUFACTURE

TECHNICAL FIELD

The present invention relates, in general, to semiconductor components and, more particularly, to power switching semiconductor components.

BACKGROUND

Metal-Oxide Semiconductor Field Effect Transistors ("MOSFETs") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state.

Today's high voltage power switch market is driven by two major parameters: breakdown voltage ("BVdss") and on-state resistance ("Rdson"). For a specific application, a minimum breakdown voltage is required, and in practice, designers typically can meet a BVdss specification. However, this is often at the expense of Rdson. This trade-off in performance is a major design challenge for manufacturers and users of high voltage power switching devices. Another challenge arises because Power MOSFET devices have an inherent P-N diode between a P-type conductivity body region and an N-type conductivity epitaxial region. This inherent P-N diode turns on under certain operating conditions and stores charge across the P-N junction. When a sudden reverse bias is applied to the P-N diode, the stored charge produces a negative current flow until the charge is completely depleted. The time for the charge to become depleted is referred to as the reverse recovery time ("Trr") and delays the switching speed of the power MOSFET devices. In addition, the stored charge ("Qrr") also causes a loss in the switching voltage levels due to the peak reverse recovery current ("Irr") and the reverse recovery time.

Accordingly, it would be advantageous to have a semiconductor component that has a lower Rdson with a higher breakdown voltage and lower switching losses, i.e., lower Qrr losses, and a method for manufacturing the semiconductor component. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference numbers designate like elements and in which.

For simplicity of illustration and ease of understanding, elements in the various figures are not necessarily drawn to scale, unless explicitly so stated. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or abstract.

DETAILED DESCRIPTION

Generally, the present invention provides a semiconductor component that may include a Schottky device, a semiconductor device such as a field effect transistor or a trench field effect transistor, a vertical power field effect transistor, a power field effect transistor, an edge termination structure, or combinations thereof. It should be noted that a power field effect transistor is also referred to as a vertical power device and a vertical field effect transistor is also referred to as a power device. In accordance with one embodiment, a semiconductor component is formed in a semiconductor material comprising two layers of epitaxial material disposed over a semiconductor substrate. The epitaxial layers and the semiconductor substrate have the same conductivity type, but the resistivity of the top epitaxial layer is greater than that of the semiconductor substrate. The Schottky device and a power field effect transistor are formed from the top epitaxial layer. The Schottky device is formed from a plurality of trench structures.

In accordance with another embodiment, the devices are formed in a semiconductor material comprising a single layer of epitaxial material disposed over a semiconductor substrate. The epitaxial layer and the semiconductor substrate have the same conductivity type, but the resistivity of the epitaxial layer is greater than that of the semiconductor substrate. A doped region of the same conductivity type as the epitaxial layer is formed in the epitaxial layer. The Schottky device is formed from a plurality of trench structures. Preferably, the distance between the trench structures in the single epitaxial layer embodiment is less than the distance between the trench structures in the double epitaxial layer embodiment. For example the distance between Schottky trench structures in the single epitaxial layer embodiment may be about 0.6 micrometers whereas the distance between Schottky trench structures in the double epitaxial layer embodiment may be about 1.2 micrometers.

In accordance with another embodiment, an edge termination structure is formed from the top epitaxial layer of a semiconductor material comprising two epitaxial layers.

In accordance with another embodiment, an edge termination structure is formed from an epitaxial layer in which a doped region of the same conductivity type as the epitaxial layer has been formed.

Figure 1:
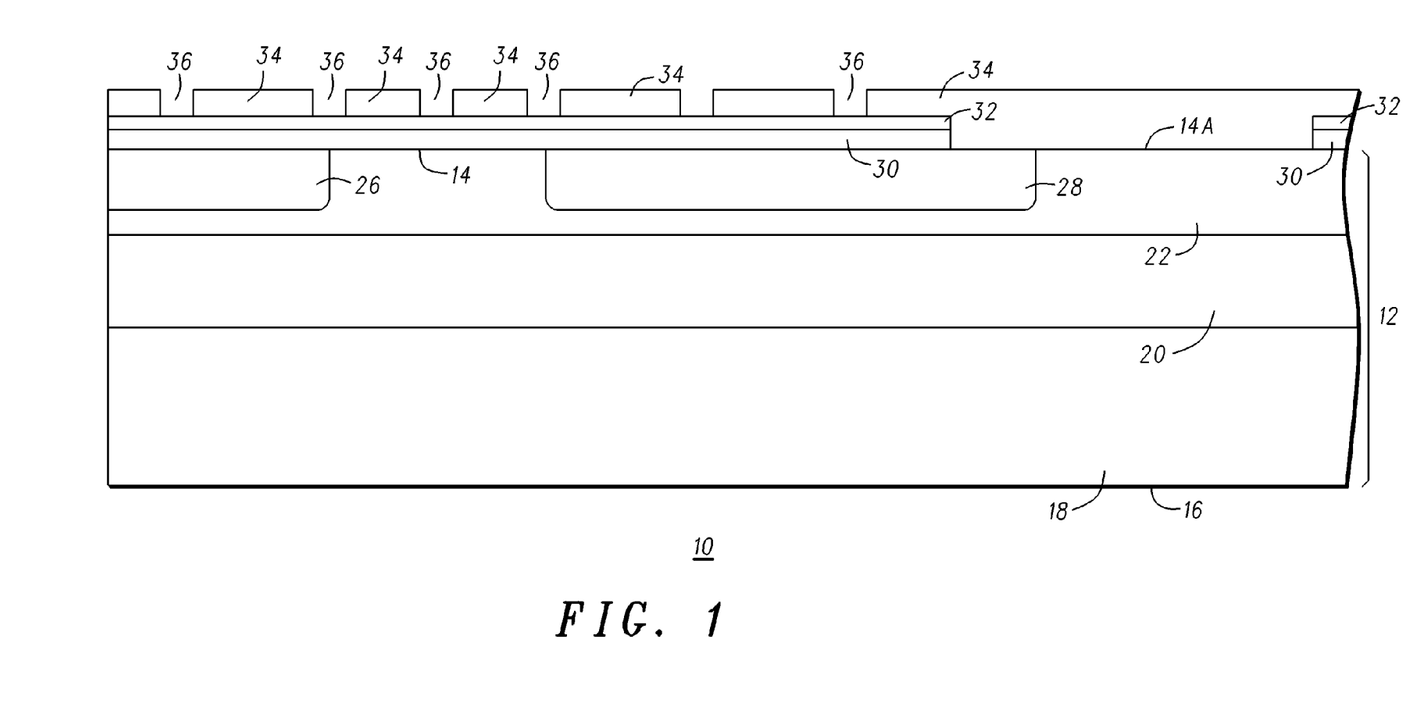
FIG. 1 is a cross-sectional view of a semiconductor component at an early stage of manufacture in accordance with an embodiment of the present invention.

FIG. 1 is a cross-sectional view of a portion of a semiconductor component 10 during manufacture in accordance with an embodiment of the present invention. What is shown in FIG. 1 is a semiconductor material 12 having opposing surfaces 14 and 16. Surface 14 is also referred to as a front or top surface and surface 16 is also referred to as a bottom or back surface. In accordance with one embodiment, semiconductor material 12 comprises an epitaxial layer 20 disposed on a semiconductor substrate 18 and an epitaxial layer 22 disposed on epitaxial layer 20. Preferably, substrate 18 is silicon that is heavily doped with an N-type dopant or impurity material and epitaxial layers 20 and 22 are silicon lightly doped with an N-type dopant. In an example of a semiconductor device having a 30 volt breakdown voltage, the resistivity of substrate layer 18 may be less than about 0.01 Ohm-centimeters ("Ω-cm"), the resistivity of epitaxial layer 20 may be greater than about 0.1Ω-cm, and the resistivity of epitaxial layer 22 may be greater than about 0.2Ω-cm and preferably greater than about 0.4Ω-cm. Substrate layer 18 provides a low resistance conduction path for the current that flows through a power transistor and a low resistance electrical connection to a bottom drain conductor that is formed on bottom surface 16 of substrate 12, a top drain conductor, or both. A region or layer doped with an N-type dopant is referred to as having an N-type conductivity or an N conductivity type and a region or layer doped with a P-type dopant is referred to as having a P-type conductivity or a P conductivity type.

P-type conductivity doped regions 26 and 28 are formed in epitaxial layer 22. Doped regions 26 and 28 are laterally spaced apart from each other and preferably are doped with boron. Doped regions 26 and 28 may be formed using an implantation technique with a dose ranging from about $1 \times 10^{13}$ ions per centimeter squared (ions/cm$^2$) to about $1 \times 10^{14}$ ions/cm$^2$. The technique for forming doped regions 26 and 28 is not limited to an implantation technique.

A layer of dielectric material 30 is formed on or from epitaxial layer 22 and a protective layer 32 is formed on dielectric layer 30. In accordance with one embodiment, the material of dielectric layer 30 is silicon dioxide and the material of protective layer 32 is silicon nitride. Preferably, the materials of layers 30 and 32 are selected so that protective layer 32 restricts oxygen diffusion and therefore protects underlying layers from oxidation. Although protective layer 32 is shown as a single layer of material, it can also be a multi-layered structure of different material types. A layer of photoresist (not shown) is formed on protective layer 32 and patterned to expose portions of protective layer 32. The exposed portions of protective layer 32 and the portions of dielectric layer 30 under the exposed portions of protective layer 32 are anisotropically etched to expose a portion 14A of surface 14. Exposed portion 14A will be oxidized during field oxide formation. The layer of photoresist is removed and another layer of photoresist is formed on protective layer 32 and on portion 14A of surface 14. The layer of photoresist is patterned to form a masking structure 34 having openings 36 that expose portions of protective layer 32. It should be noted that a masking structure is also referred to as a mask.

Figure 2:
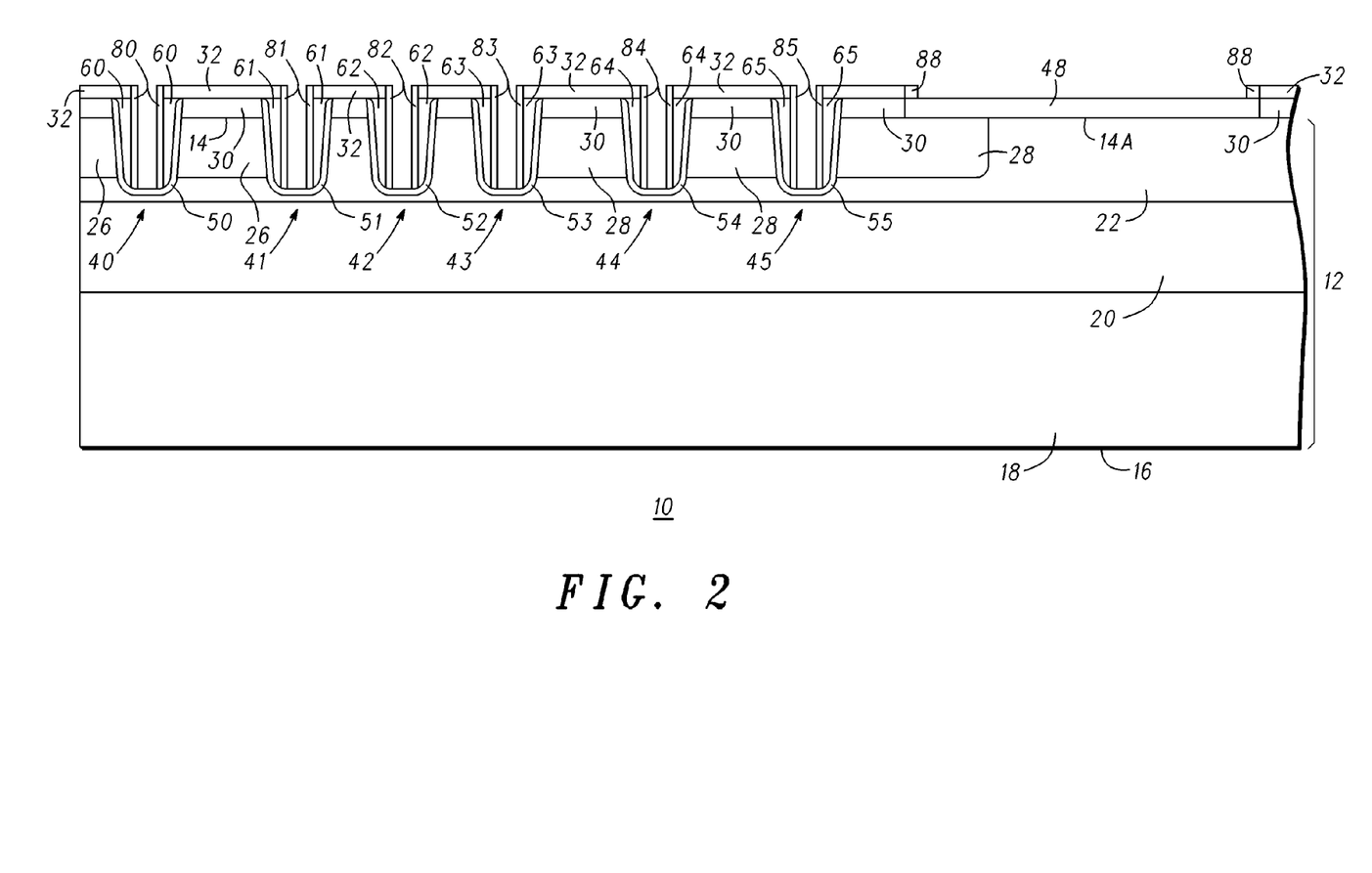
FIG. 2 is a cross-sectional view of the semiconductor component of FIG. 1 at a later stage of manufacture.

Referring now to FIG. 2, the exposed portions of protective layer 32 and the portions of dielectric layer 30 and semiconductor layer 22 below the exposed portions of protective layer 32 are anisotropically etched using, for example, a reactive ion etch to form trenches 40, 41, 42, 43, 44, and 45. Trenches 41-43 are typically referred to as Schottky trenches. In accordance with one embodiment, layers 32 and 30 are etched using an anisotropic fluorine based reactive ion etch and trenches 40-45 are formed in semiconductor layer 22 using a reactive ion etch with a chlorine or bromine chemistry or fluorine based techniques such as the Bosch process. Preferably, the distance that trenches 40-45 extend from surface 14 into epitaxial layer 22 is greater than the distance that doped regions 26 and 28 extend from surface 14 into epitaxial layer 22. Although trenches 40-45 are shown as being within epitaxial layer 22, this is not a limitation of the present invention. For example, trenches 40-45 may extend through epitaxial layer 22 and into epitaxial layer 20.

Trenches 40-45 generally have sidewalls that are aligned with the edges of the openings through layers 32 and 30. The sidewalls are oxidized to form an oxide layer that extends into the sidewalls and the bottoms of each trench 40-45 causing the sidewalls to be pulled-back or recessed under protective layer 32. The oxide is removed from the sidewalls and the bottoms of trenches 40-45. The amount of the pull-back or recess usually is determined by the thickness of the oxide layers and the amount of oxide that is removed. Preferably, each oxide layer is formed to have a thickness of about 100 nanometers ("nm"). During the removal of each oxide layer from the sidewalls, a portion of dielectric layer 30 is also removed from under the portions of protective layer 32 that are adjacent to the openings in protective layer 32. Typically, the process for removing the oxide layers is preferential to oxide and follows the portions of dielectric layer 30 that are abutting the oxide layers.

Removing the portions of dielectric layer 30 also removes portions of the trench sidewalls near surface 14 giving a curvature in the portions of the trench sidewalls near surface 14. The removal of the portion of dielectric layer 30 underlying protective layer 32 leaves portions of protective layer 32 overhanging the openings of trenches 40-45. The overhanging portions serve as ledges. The undercutting of protective layer 32 also causes the widths of the mouths of trenches 40-45 proximal to surface 14 to be wider than the widths of trenches 40-45 along the portions of their sidewalls that are distal from surface 14.

Silicon dioxide layers 50, 51, 52, 53, 54, and 55 are formed along the sidewalls and bottoms of trenches 40-45, respectively, and a silicon dioxide layer 48 is formed on exposed portion 14A of surface 14. In a preferred embodiment, the portions of silicon dioxide layers 50, 54, and 55 formed along the sidewalls of trenches 40, 44, and 45, respectively, serve as gate oxide layers for power transistors. Typically, the thickness of each silicon dioxide layer 50-55 ranges from about 20 nm to about 100 nm. A conformal layer of polysilicon having a thickness ranging from about 20 nm to about 50 nm is formed on silicon dioxide layers 50-55, protective layer 32, and oxide layer 48. The polysilicon layer is anisotropically etched to expose the portions of silicon dioxide layers 50-55 at the bottoms of the respective trenches 40-45. After the anisotropic etch, portions 60, 61, 62, 63, 64, and 65 of the polysilicon layer remain disposed on the portions of silicon dioxide layers 50-55 adjacent the sidewalls of trenches 40-45, respectively.

A protective layer (not shown) is formed on layer 32, oxide layer 48, polysilicon portions 60-65, and the exposed portions of silicon dioxide layers 50-55 at the bottom of trenches 40-45, respectively. The protective layer is generally formed from the same material as layer 32. The protective layer is anisotropically etched to form portions 80, 81, 82, 83, 84, 85, and 88 on polysilicon portions 60-65 and oxide layer 48, respectively.

Figure 3:
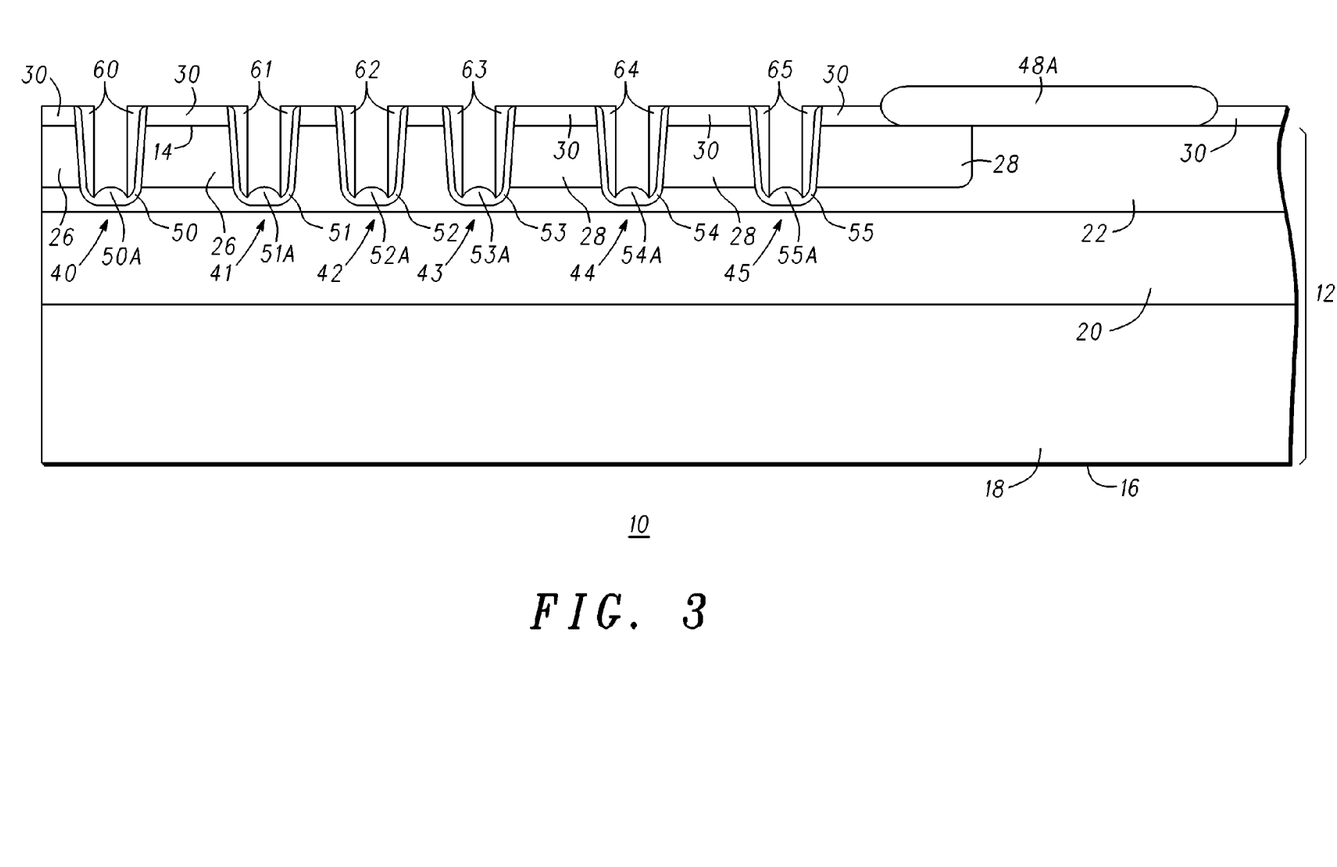
FIG. 3 is a cross-sectional view of the semiconductor component of FIG. 2 at a later stage of manufacture.

Referring now to FIG. 3, the thicknesses of oxide layers 50-55 along the bottoms of trenches 40-45 are increased to form thick oxide portions 50A, 51A, 52A, 53A, 54A, and 55A, respectively. The increased thicknesses are formed without substantially increasing or changing the thicknesses of oxide layers 50-55 along the sidewalls of the respective trenches 40-45. Thick oxide layers 50A-55A are formed by further oxidizing the material at the bottoms of trenches 40-45. This oxidation also oxidizes the portions of semiconductor material 22 under oxide layer 48 to form field oxide 48A. In accordance with an embodiment of the present invention, a wet oxidation in a hydrogen and oxygen ambient at a temperature of about 1,000 degrees Celsius (° C.) is performed to form portions 50A-55A, which increases the thicknesses of oxide layers 50-55 near the bottoms of trenches 40-45, respectively, by an amount ranging from about 200 nm to about 400 nm. Silicon nitride layer 32 and portions 80, 81, 82, 83, 84, 85, and 88 are removed using, for example, hot phosphoric acid. The method for removing silicon nitride layer 32 and portions 80-85 and 88 is not a limitation of the present invention.

Figure 4:
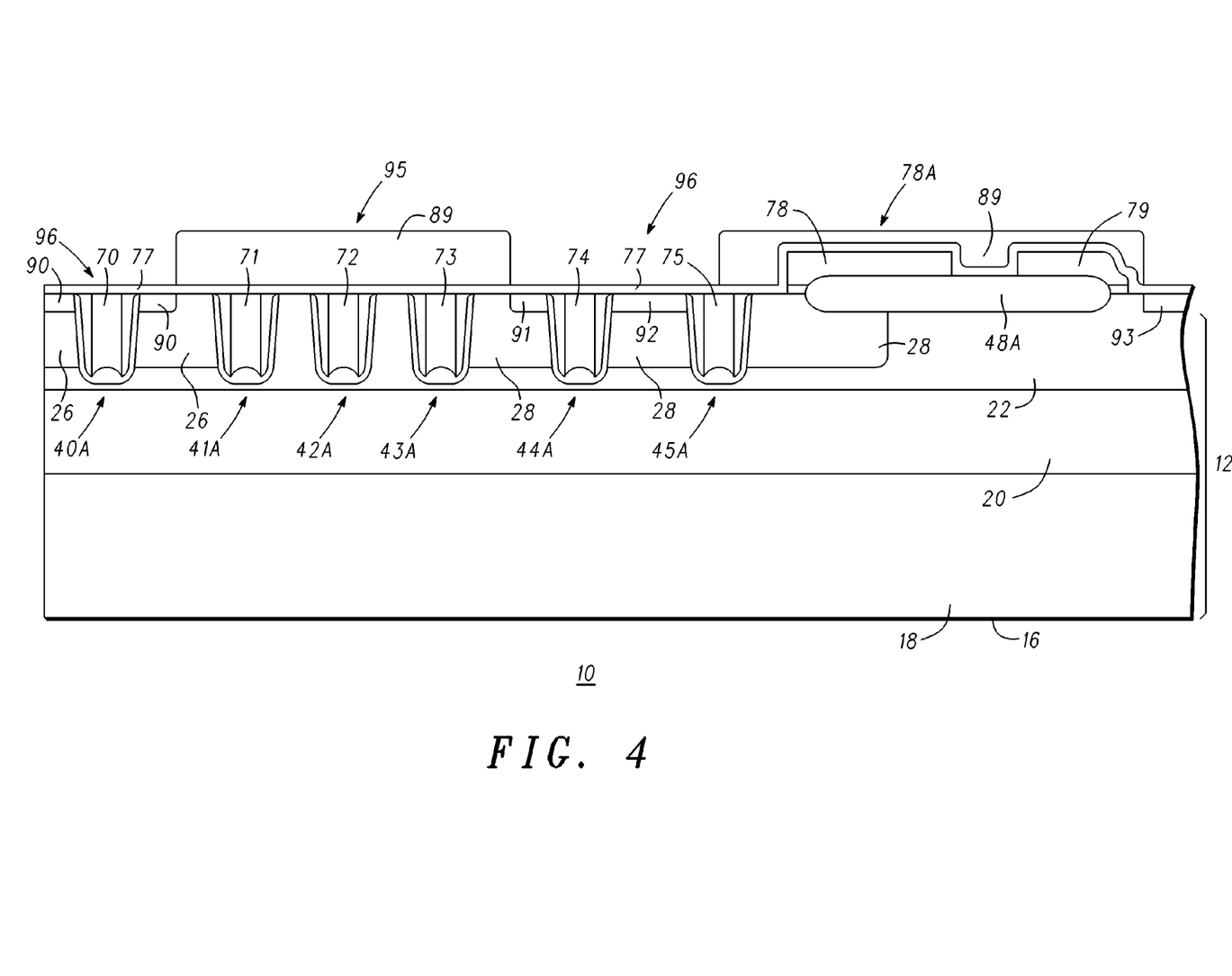
FIG. 4 is a cross-sectional view of the semiconductor component of FIG. 3 at a later stage of manufacture.

Referring now to FIG. 4, a layer of polysilicon (not shown) is formed in trenches 40-45, on the remaining portions of dielectric layer 30, and on field oxide 48A. Typically, the layer of polysilicon is in-situ doped with a dopant of N-type conductivity, or blanket implanted with a dopant of N-type conductivity followed by driving-in the dopant. The conductivity type of the dopant is not a limitation of the present invention. The polysilicon layer is etched leaving polysilicon plugs 70, 71, 72, 73, 74, and 75 in trenches 40-45. It should be noted that polysilicon plugs 70-75 include polysilicon portions 60-65, respectively. Trenches 40-45 in combination with polysilicon plugs 70-75 form polysilicon filled trenches 40A, 41A, 42A, 43A, 44A, and 45A, respectively. It should be noted that trenches 40-45 may be fully or partially filled with polysilicon and that both types of filling are referred to as polysilicon filled trenches. In addition, portions 78 and 79 of the polysilicon layer remain after the etch. Polysilicon portion 78 remains over a portion of field oxide 48A and over a portion of oxide layer 30 that is between field oxide 48A and polysilicon filled trench 45A. Polysilicon portion 78 in combination with the portion of doped region 28 between polysilicon filled trench 45A and field oxide 48A form a field plate 78A. Field plate 78A is also referred to as an edge termination structure. It should be understood that the architecture of the edge termination structure is not a limitation of the present invention. Polysilicon portion 79 remains over a portion of field oxide 48A and a portion of oxide layer 30 that is adjacent to field oxide 48A. Polysilicon portion 79 serves as drain polysilicon. The etch chemistry is adjusted to remove the portions of dielectric layer 30 unprotected by polysilicon portions 78 and 79 and the portions of dielectric layers 50-55 and polysilicon portions 60-65 adjacent to the portions of dielectric layer 30 that are unprotected by polysilicon portions 78 and 79. A screen oxide 77 is formed on polysilicon plugs 70-75, polysilicon portions 78 and 79, doped regions 26 and 28, field oxide 48A, and the portions of epitaxial layer 22 adjacent field oxide 48A.

A layer of photoresist (not shown) is formed over screen oxide 77 and polysilicon portions 78 and 79. The layer of photoresist is patterned to form a masking structure 89 that protects polysilicon plugs 71, 72, and 73, polysilicon portion 78, polysilicon portion 79, and a portion of screen oxide 77 between polysilicon portions 78 and 79. Thus, masking structure 89 protects Schottky region 95 and polysilicon portions 78 and 79. The portions of the semiconductor material that are unprotected by masking structure 89 may serve as non-Schottky device regions 96. When the non-Schottky device is a Field Effect Transistor ("FET") or a MOSFET, non-Schottky device regions 96 may be referred to as FET regions or MOSFET regions. Semiconductor device or field effect transistors that are not Schottky devices are referred to as non-Schottky devices or non-Schottky field effect transistors.

Still referring to FIG. 4, an impurity material of N-type conductivity is implanted into the portions of polysilicon filled trenches 40A-45A and epitaxial layer 22 that are unprotected by masking structure 89 to form doped regions 90 adjacent to polysilicon filled trench 40A, doped region 91 adjacent to polysilicon filled trench 44A, doped region 92 between polysilicon filled trenches 44A and 45A, and doped region 93 adjacent to and laterally spaced apart from field oxide 48A. Doped regions 90, 91, and 92 serve as source regions for power FETs. It should be noted that the doping step that forms doped regions 90-93 also dopes polysilicon plugs 70 and 74-75. For the sake of clarity the dopant or impurity material is not shown in polysilicon plugs 70, 74, and 75.

Figure 5:
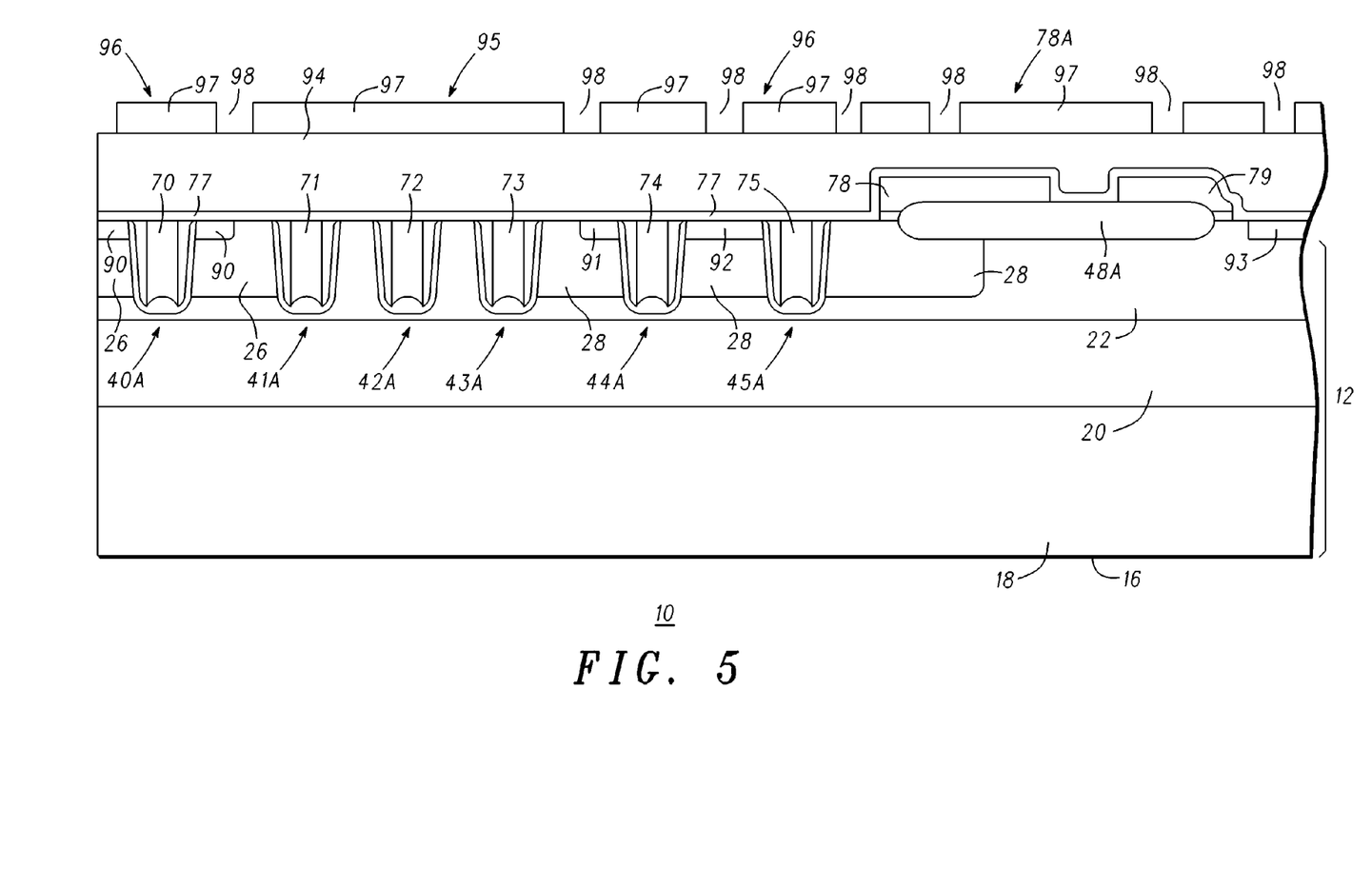
FIG. 5 is a cross-sectional view of the semiconductor component of FIG. 4 at a later stage of manufacture.

Referring now to FIG. 5, masking structure 89 is removed and a layer of dielectric material 94 is formed over screen oxide 77. Dielectric layer 94 typically is referred to as an interlayer dielectric ("ILD") layer. A layer of photoresist is formed on ILD layer 94 and patterned to a form masking structure 97 having openings 98 that expose portions of ILD layer 94 that are over a portion of doped region 26 adjacent to polysilicon filled trench 40A. Openings 98 also expose portions of ILD layer 94 over the portion of doped region 28 between polysilicon filled trenches 43A and 44A and the portion of doped region 28 between polysilicon filled trenches 44A and 45A. Openings 98 also expose portions of ILD layer 94 over polysilicon portions 78 and 79, over doped region 93, and between polysilicon filled trench 45A and field oxide region 48A.

Figure 6:
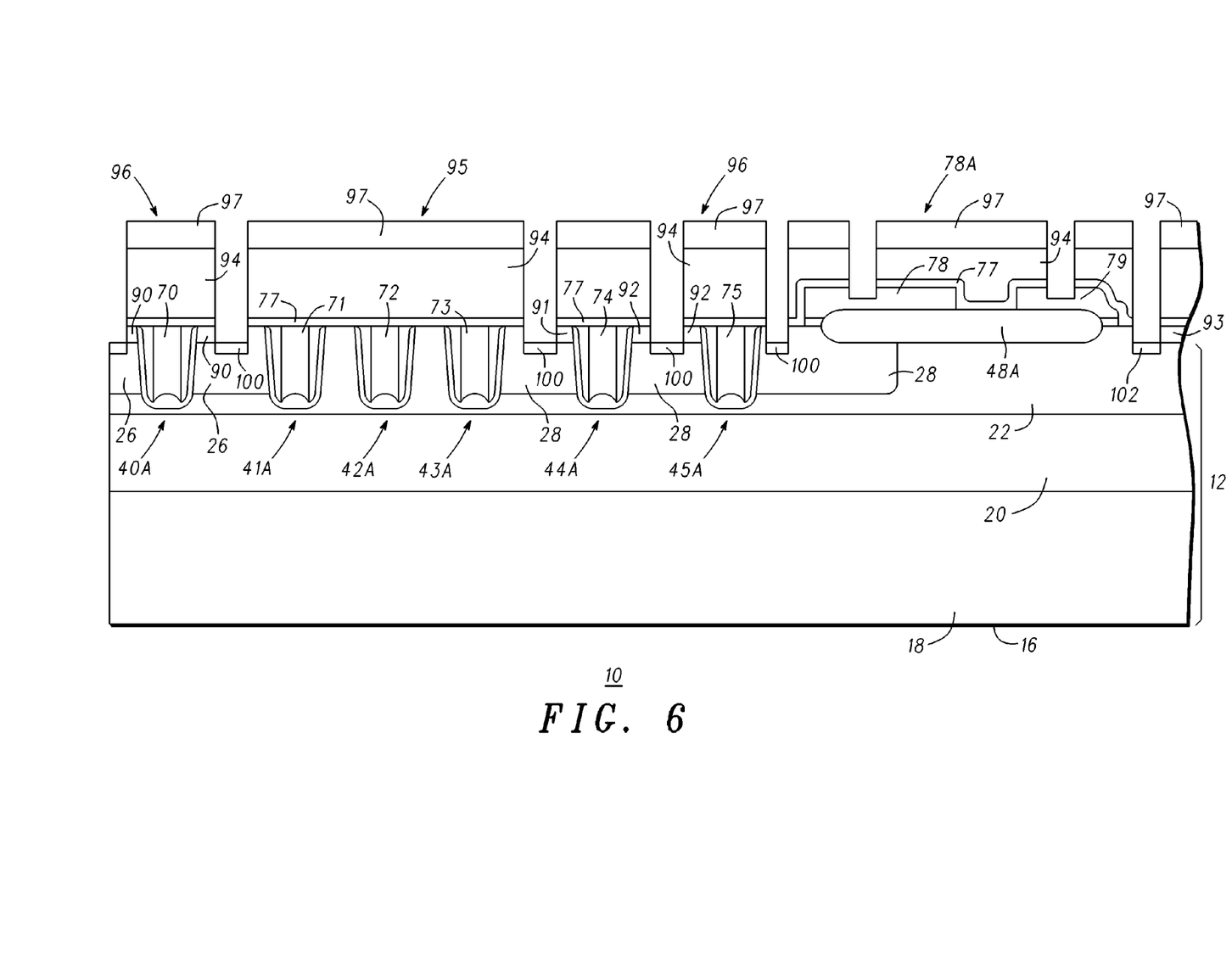
FIG. 6 is a cross-sectional view of the semiconductor component of FIG. 5 at a later stage of manufacture.

Referring now to FIG. 6, the exposed portions of ILD layer 94 and the portions of screen oxide 77 under the exposed portions of ILD layer 94 are anisotropically etched to expose portions of doped regions 26, 28, and 93 and polysilicon portions 78 and 79. Openings are formed in the exposed portions of doped regions 26, 28, and 93 and polysilicon portions 78 and 79 using, for example, an anisotropic etch. The opening in doped region 93 exposes a portion of epitaxial layer 22. Techniques for anisotropically etching dielectric material and semiconductor material are known to those skilled in the art. It should be understood that the techniques for etching ILD layer 94, screen oxide 77 and doped regions 26, 28, and 93 and polysilicon portions 78 and 79 are not limited to anisotropic etching techniques. For example, they can be performed using isotropic etching techniques. An impurity material of P-type conductivity is implanted into the exposed portions of doped regions 26 and 28 to form doped regions 100. The P-type conductivity impurity material is also implanted into the exposed portion of epitaxial layer 22 to form a doped region 102. Doped regions 100 help to form good body contact between doped regions 26 and 28 and a source conductor metal described with reference to FIG. 8. The exposed portions of polysilicon portions 78 and 79 are also doped with the impurity material forming doped regions 100. For the sake of clarity the dopant or impurity material is not shown in polysilicon portions 78 and 79.

Figure 7:
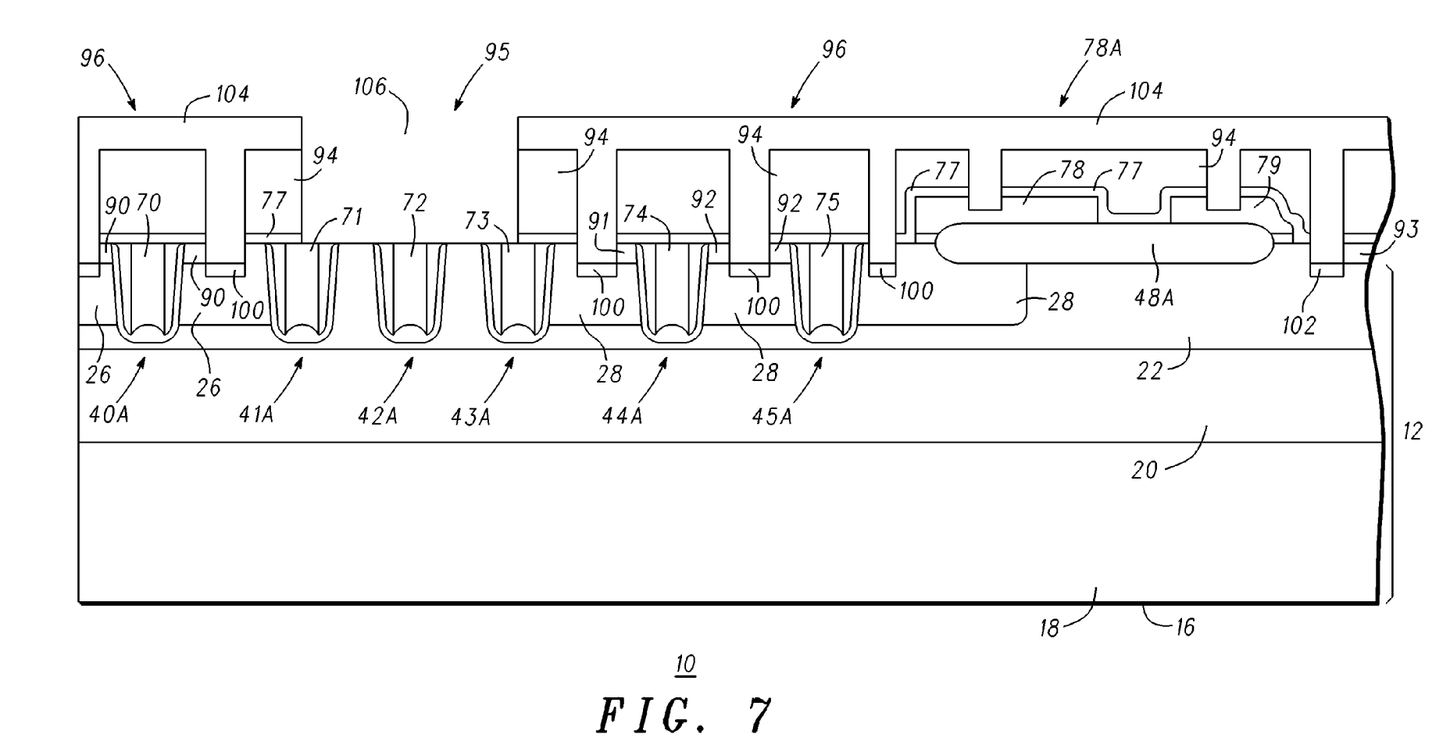
FIG. 7 is a cross-sectional view of the semiconductor component of FIG. 6 at a later stage of manufacture.

Referring now to FIG. 7, masking structure 97 is removed and another layer of photoresist (not shown) is formed over ILD layer 94 and in the openings formed in doped regions 26 and 28, epitaxial layer 22, and polysilicon portions 78 and 79. The layer of photoresist is patterned to form a masking structure 104 having an opening 106 that exposes the portion of ILD layer 94 between polysilicon filled trenches 41A and 43A and the portion of ILD layer 94 above portions of polysilicon filled trenches 41A and 43A. The exposed portion of ILD layer 94 and the portion of screen oxide 77 below the exposed portion of ILD layer 94 are anisotropically etched using, for example, a reactive ion etch to expose polysilicon plugs 71, 72, and 73. It should be noted that the etch is not limited to being an anisotropic etch but can also be an isotropic etch. Masking structure 104 is removed using a technique known to those skilled in the art.

Figure 8:
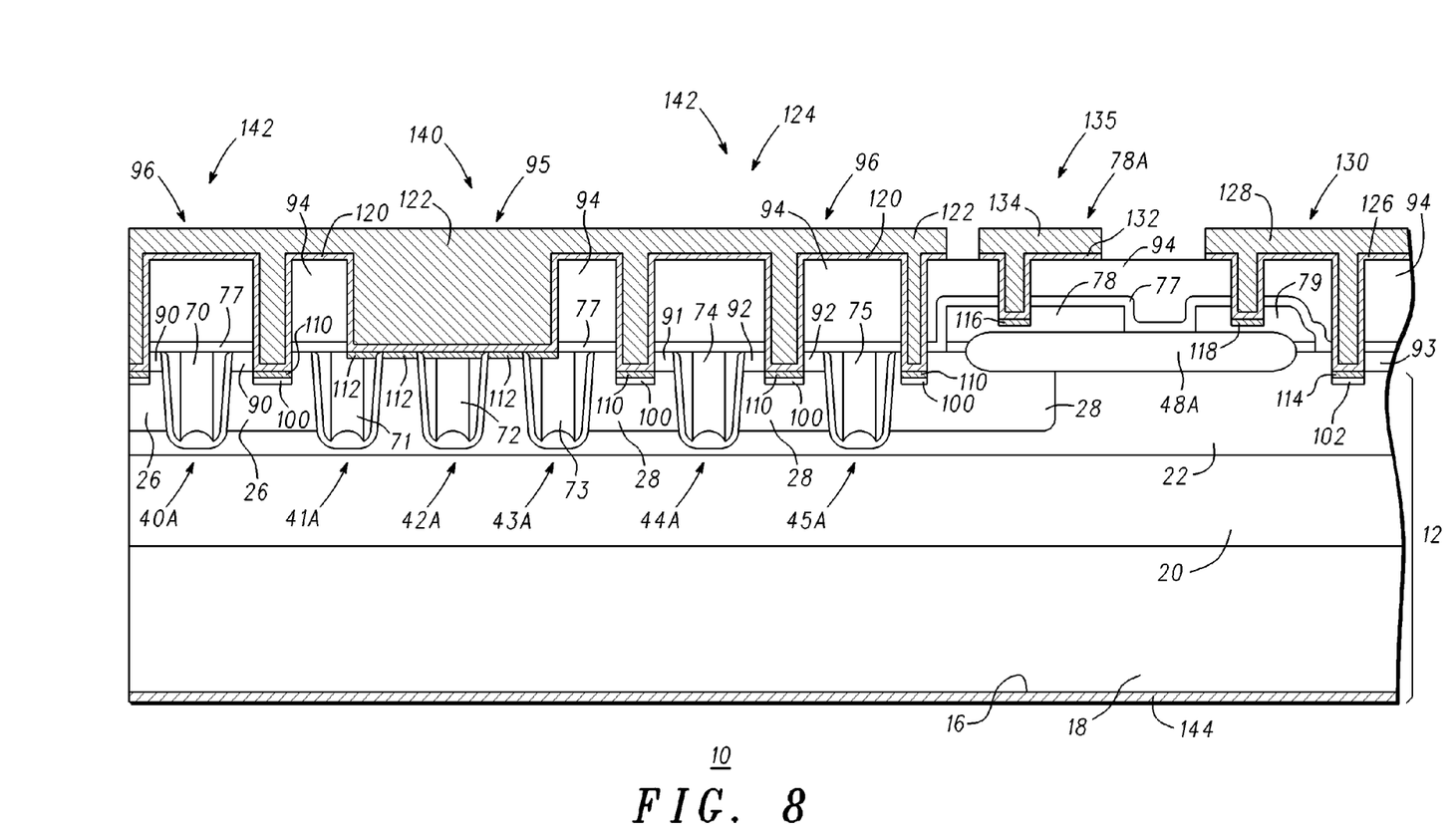
FIG. 8 is a cross-sectional view of the semiconductor component of FIG. 7 at a later stage of manufacture.

Referring now to FIG. 8, a layer of refractory metal (not shown) is conformally deposited over the exposed portions of doped regions 100 and 102, polysilicon plugs 71-73, polysilicon portions 78 and 79, and on ILD layer 94. By way of example, the refractory metal is titanium having a thickness ranging from about 100 Å to about 1,000 Å. The refractory metal is heated to a temperature ranging from about 350° C. to about 700° C. The heat treatment causes the titanium to react with the silicon to form titanium silicide in all regions in which the titanium is in contact with silicon or polysilicon. Thus, titanium silicide layers 110 are formed from doped regions 100, a titanium silicide layer 112 is formed from polysilicon plugs 71-73 and portions of epitaxial layer 22 that are between polysilicon plugs 71-73, a titanium silicide layer 114 is formed from a portion of doped region 102, a titanium silicide layer 116 is formed from polysilicon portion 78, and a titanium silicide layer 118 is formed from polysilicon portion 79. The portions of the titanium over ILD layer 94 remain unreacted. Although the portions of the titanium layer over the exposed portions of oxide layers 51-53 do not form silicide, they are shown as being continuous with silicide layer 112 for the sake of clarity. As those skilled in the art are aware, silicide layers that are self aligned are referred to as salicide layers. Thus, layers 110, 112, 114, 116, and 118 may be referred to as salicide layers. It should be understood that the type of silicide is not a limitation of the present invention. For example, other suitable silicides include nickel silicide, platinum silicide, cobalt silicide, or the like. As those skilled in the art are aware, silicon is consumed during the formation of silicide and the amount of silicon consumed is a function of the type of silicide being formed.

A barrier layer is formed in contact with titanium silicide layers 110, 112, 114, 116, and 118 and over ILD layer 94. Suitable materials for the barrier layer include titanium nitride, titanium tungsten, or the like. A metal layer such as, for example, aluminum, is formed in contact with the barrier layer. A layer of photoresist (not shown) is formed on the metal layer and patterned to expose portions of the metal layer. The exposed portions of the metal layer and the portions of the barrier layer below the exposed portions of the metal layer are etched to form electrical conductors. More particularly, silicide layers 110, a portion 120 of the barrier layer, and a portion 122 of the metal layer cooperate to form a source contact and portions of silicide layers 112, another portion 120 of the barrier layer, and another portion 122 of the metal layer cooperate to form a Schottky contact. The source contact and the Schottky contact share a common metallization system and are therefore referred to as a source electrode 124. In addition, silicide layers 114 and 118, portion 126 of the barrier layer, and portion 128 of the metal layer form a top side drain contact 130 and silicide layer 116, portion 132 of the barrier layer, and portion 134 of the metal layer form a gate contact 135. Source contact 124 also serves as an anode for a Schottky diode 140 and as source and body contacts for power FETs 142. A conductor 144 is formed in contact with surface 16 and serves as the cathode of Schottky diode 140 and as a bottom side drain contact for power FETs 142.

Suitable metallization systems for conductor 144 include a gold alloy, titanium-nickel-gold, titanium-nickel-silver, or the like. It should be understood that the type of Schottky device manufactured in Schottky region 95 is not limited to being a Schottky diode. Other types of Schottky devices may also be manufactured in Schottky region 95. It should be further understood that the type of semiconductor device manufactured from semiconductor material 12 is not limited to being a power FET or a trench FET.

Figure 9:
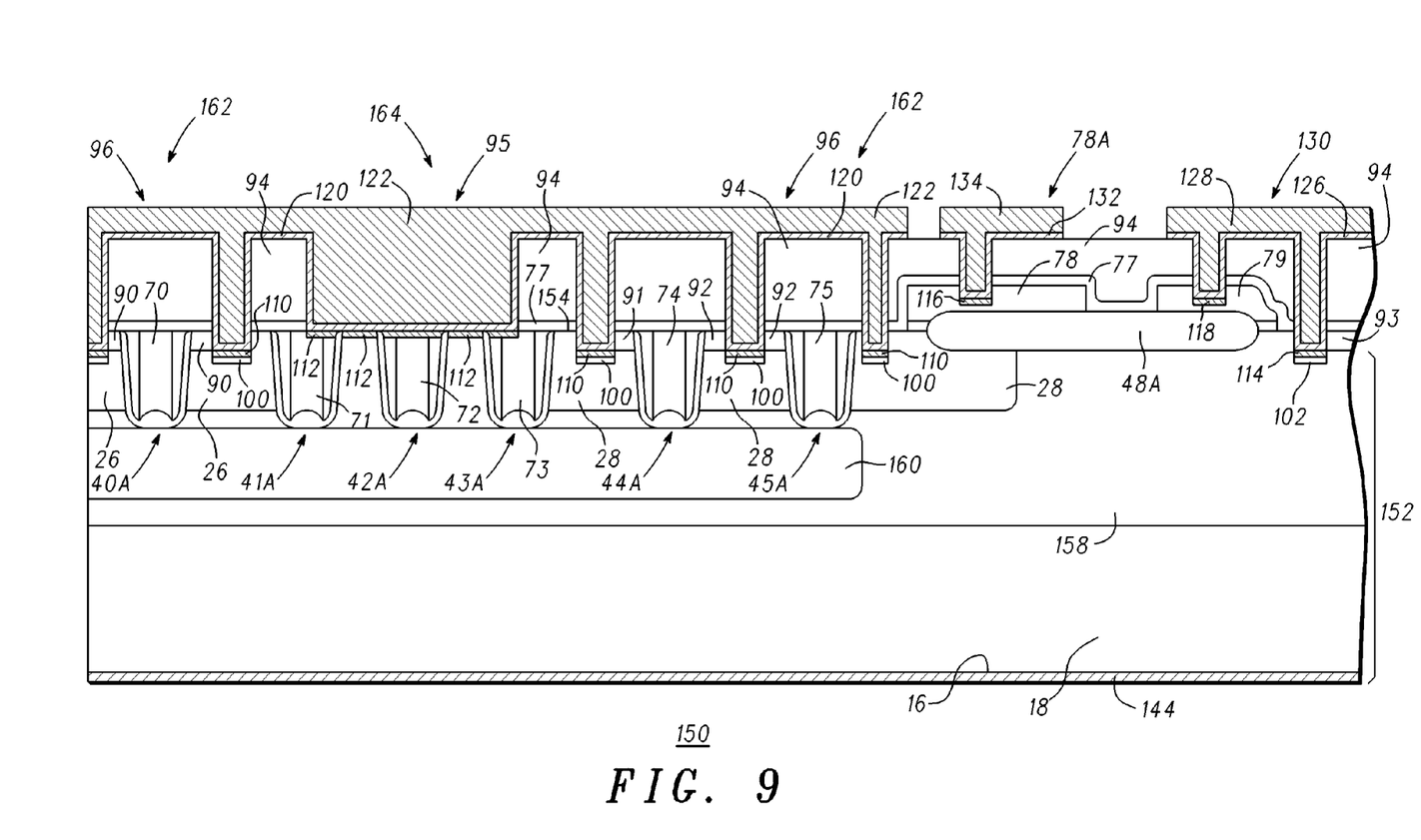
FIG. 9 is a cross-sectional view of a semiconductor component during manufacture in accordance with another embodiment of the present invention.

FIG. 9 is a cross-sectional view of a semiconductor component 150 in accordance with another embodiment of the present invention. What is shown in FIG. 9 is a semiconductor material 152 having opposing surfaces 154 and 16. Surface 154 is also referred to as a front or top surface and surface 16 is also referred to as a bottom or back surface. In accordance with one embodiment, semiconductor material 152 comprises an epitaxial layer 158 disposed on a semiconductor substrate 18. Substrate 18 was described with reference to FIG. 1. Preferably, substrate 18 is silicon that is heavily doped with an N-type dopant or impurity material and epitaxial layer 158 is silicon lightly doped with an N-type dopant. By way of example, the resistivity of substrate layer 18 typically is less than about 0.01Ω-cm and the resistivity of epitaxial layer 158 typically is greater than about 0.2Ω-cm and preferably greater than about 0.4Ω-cm. Substrate layer 18 provides a low resistance conduction path for the current that flows through a power transistor and a low resistance electrical connection to a drain conductor that is formed on bottom surface 16 of substrate 12. Thus, semiconductor material 152 is similar to semiconductor material 12 except that a single epitaxial layer is formed over semiconductor substrate 18. In addition, a doped region 160 is formed in the portions of epitaxial layer 158 that are below the source and body regions of power FETs 162 and the anode region of a Schottky diode 164. By way of example, doped region 160 is formed by implanting an impurity material of N-type conductivity into epitaxial layer 158 at a dose ranging from about $3\times10^{12}$ atoms/cm$^2$ to about $1\times10^{14}$ atoms/cm$^2$ and at an implant energy ranging from about 1 Mega electron-volt ("MeV") to about 5 MeV.

By now it should be appreciated that a semiconductor component comprising a Schottky device, a non-Schottky semiconductor device, an edge termination structure, or combinations thereof have been provided. An advantage of forming two epitaxial layers over the semiconductor substrate such that the upper epitaxial layer has a higher resistivity than the lower epitaxial layer and both epitaxial layers have a higher resistivity than the substrate is that a Schottky contact can be formed to the higher resistivity upper epitaxial layer and portions of field effect transistors can be formed from the lower resistivity lower epitaxial layer. Thus, a Schottky device and a field effect transistor can be formed from the same semiconductor material. Forming the Schottky contact to the higher resistivity upper epitaxial layer lowers the leakage current that occurs at or during pinch-off and forming the body of the field effect transistors from the higher resistivity upper epitaxial layer does not impact the on resistance but rather helps enhance the breakdown voltage. These advantages also occur in embodiments having a single epitaxial layer that has a doped region such as doped region 160. In addition, the dual layer epitaxial semiconductor material or the single layer epitaxial semiconductor material with doped region 160 increases the edge breakdown voltage of the field effect transistors.

Although certain preferred embodiments and methods have been disclosed herein, it will be apparent from the foregoing disclosure to those skilled in the art that variations and modifications of such embodiments and methods may be made without departing from the spirit and scope of the invention. For example, the masks or masking structures may be comprised of a single mask or masking structure with a plurality of openings formed therein or there may be a plurality of masks or masking structures spaced apart by one or more openings. In addition, the semiconductor devices may be vertical devices as such as power FET's 142 and 162 or lateral devices. It is intended that the invention shall be limited only to the extent required by the appended claims and the rules and principles of applicable law.

What is claimed is:

1. A method for manufacturing a semiconductor component, comprising:
    providing a semiconductor material having a major surface, wherein the semiconductor material includes a first epitaxial layer disposed over a substrate and a second epitaxial layer disposed over a portion of the first epitaxial layer, and wherein the first epitaxial layer is between and contacts the substrate and the second epitaxial layer and the second epitaxial layer has a surface that serves as the major surface of the semiconductor material;
    forming a plurality of trenches in the semiconductor material, wherein first and second trenches of the plurality of trenches extend from the major surface into the second epitaxial layer, and wherein the first trench has first and second opposing sidewalls and a bottom and the second trench has first and second opposing sidewalls and a bottom;
    forming a first dielectric material adjacent to the first and second sidewalls and the bottom of the first trench and a second dielectric material adjacent to the first and second sidewalls and the bottom of the second trench, the first and second dielectric materials extending from the major surface to the bottoms of the first and second trenches;
    forming a first polysilicon plug in the first trench and a second polysilicon plug in the second trench, the first polysilicon plug extending from the major surface to a region adjacent the bottom of the first trench and the second polysilicon plug extending from the major surface to a region adjacent the bottom of the second trench;
    forming a first doped region laterally adjacent the second trench;
    forming a Schottky contact to a first portion of the major surface of the second epitaxial layer and adjacent the first trench; and
    forming an edge termination structure over a second portion of the second epitaxial layer, wherein forming the edge termination structure comprises:
    forming a dielectric layer from the major surface of the second epitaxial layer, the dielectric layer having first and second opposing surfaces;
    forming a junction that terminates in a portion of the second epitaxial layer that is under the dielectric layer and adjacent the first opposing surface of the dielectric layer; and
    forming an electrically conductive material over the second opposing surface of the dielectric layer, the electrically conductive material extending beyond the junction.

2. The method of claim 1, wherein providing the semiconductor material includes providing the substrate, the first epitaxial layer, and the second epitaxial layer of a first conductivity type.

3. The method of claim 2, wherein the resistivity of the second epitaxial layer is greater than the resistivity of the first epitaxial layer.

4. The method of claim 3, further including forming a power device from a second portion of the second epitaxial layer.

5. The method of claim 4, wherein forming the power device comprises forming a power field effect transistor.

6. The method of claim 4, wherein forming the power device comprises forming a vertical power device.

7. The method of claim 1, further including forming an edge termination structure over a second portion of the second epitaxial layer.

8. The method of claim 1, wherein a first portion of the first dielectric material adjacent the bottoms of the first and second trenches is thicker than a second portion of the first dielectric material adjacent the first and second sidewalls of the first and second trenches.

9. A method for manufacturing a semiconductor component, comprising:
    providing a semiconductor substrate of a first conductivity type;
    forming a first epitaxial layer of the first conductivity type and a first resistivity over the semiconductor substrate;
    forming a second epitaxial layer of the first conductivity type and a second resistivity over the first epitaxial layer, the first epitaxial layer in contact with the semiconductor substrate and the second epitaxial layer, the second resistivity greater than the first resistivity;
    forming a plurality of trenches in the semiconductor material, wherein first and second trenches of the plurality of trenches extend from the major surface into the second epitaxial layer, and wherein the first trench has first and second opposing sidewalls and a bottom and the second trench has first and second opposing sidewalls and a bottom;
    forming a first dielectric material adjacent to the first and second sidewalls and the bottom of the first trench and a second dielectric material adjacent to the first and second sidewalls and the bottom of the second trench, the first and second dielectric materials extending from the major surface to the bottoms of the first and second trenches;
    forming a first polysilicon plug in the first trench and a second polysilicon plug in the second trench, the first polysilicon plug extending from the major surface to a region adjacent the bottom of the first trench and the second polysilicon plug extending from the major surface to a region adjacent the bottom of the second trench;
    forming a first doped region laterally adjacent the second trench;
    forming a Schottky contact to a first portion of the second epitaxial layer adjacent the first trench; and
    forming an edge termination structure over a second portion of the second epitaxial layer, wherein forming the edge termination structure comprises:
    forming a dielectric layer from the major surface of the second epitaxial layer, the dielectric layer having first and second opposing surfaces;
    forming a junction that terminates in a portion of the second epitaxial layer that is under the dielectric layer and adjacent the first opposing surface of the dielectric layer; and
    forming an electrically conductive material over the second opposing surface of the dielectric layer, the electrically conductive material extending beyond the junction.

10. The method of claim 9, further including forming a first semiconductor device from a second portion of the second epitaxial layer, wherein the first and second portions are positioned laterally adjacent to each other.

11. The method of claim 10, wherein the first semiconductor device is a field effect transistor.

12. The method of claim 11, wherein the field effect transistor is a power field effect transistor.

13. The method of claim 9, wherein the Schottky contact forms a portion of a Schottky diode.

14. The method of claim 9, wherein a first portion of the first dielectric material adjacent the bottoms of the first and second trenches is thicker than a second portion of the first dielectric material adjacent the first and second sidewalls of the first and second trenches.

15. A method for manufacturing a semiconductor component, comprising:

provoding a semiconductor material which comprises a first epitaxial layer of a first conductivity type and a first resistivity disposed over a substrate and a second epitaxial layer between the first epitaxial layer and the substrate, the first epitaxial layer having a major surface;

forming a plurality of trenches in the semiconductor material, wherein first and second trenches of the plurality of trenches extend from the major surface into the first epitaxial layer, and wherein the first trench has first and second opposing sidewalls and a first bottom and the second trench has third and fourth opposing sidewalls and a second bottom;

forming a first dielectric material adjacent to the first and second opposing sidewalls and the first bottom of the first trench and a second dielectric material adjacent the third and fourth opposing sidewalls and the second bottom of the second trench, the first and second dielectric materials extending from the major surface to the bottoms of the first and second trenches;

forming a first polysilicon plug in the first trench and a second polysilicon plug in the second trench, the first polysilicon plug extending from the major surface to a region of adjacent the first bottom of the first trench and the second polysilicon plug extending from the major surface to a region adjacent the second bottom of the second trench;

forming a first doped region laterally adjacent the second trench;

forming a doped region of the first conductivity type in the first epitaxial layer; and forming an edge termination structure over a first portion of the first epitaxial layer, the edge termination structure comprising:

forming a dielectric layer from the major surface of the first epitaxial layer, the dielectric layer having first and second opposing surfaces;

forming a junction that terminates in a portion of the first epitaxial layer that is under the dielectric layer and adjacent the first opposing surface of the dielectric layer; and forming an electrically conductive material over the second opposing surface of the dielectric layer, the electrically conductive material extending beyond the junction.

16. The method of claim 15, further including forming a semiconductor device from a second portion of the first epitaxial layer, the second portion of the first epitaxial layer over the doped region and laterally spaced apart from the first portion of the first epitaxial layer.

17. The method of claim 16, further including forming a field effect transistor as the semiconductor device.

18. The method of claim 15, further including forming a trench barrier Schottky device from the first trench and from a first portion of the first epitaxial layer adjacent the major surface.

19. The method of claim 15, wherein first portions of the first dielectric materials adjacent the bottoms of the first and second trenches, respectively, is thicker than second portions of the first dielectric materials adjacent the first and second sidewalls of the first and second trenches, respectively.

* * * * *